United States Patent [19]

Fisher et al.

[11] Patent Number: 4,481,433
[45] Date of Patent: Nov. 6, 1984

[54] VOLTAGE CLAMP CIRCUIT UTILIZING AN ACTIVE DEVICE

[75] Inventors: Eldon M. Fisher; Richard B. Elder, both of Acton, Mass.

[73] Assignee: RCA Corporation, New York, N.Y.

[21] Appl. No.: 402,903

[22] Filed: Jul. 29, 1982

[51] Int. Cl.³ .............................................. H03K 5/08
[52] U.S. Cl. ................................. 307/546; 307/555; 307/562
[58] Field of Search ............... 307/540, 546, 553, 555, 307/562, 264; 330/110

[56] References Cited

U.S. PATENT DOCUMENTS 3,404,348 10/1968 Hansen et al. ...................... 330/110
3,440,557 4/1969 Sundeen, Jr. ....................... 330/110

OTHER PUBLICATIONS

J. G. Graeme et al., "Operational Amplifiers, Design and Applications" McGraw-Hill Book Co., pp. 247-248, 1971.

Primary Examiner—John Zazworsky
Attorney, Agent, or Firm—J. S. Tripoli; R. L. Troike; R. E. Smiley

[57] ABSTRACT

A clamp circuit in which, so long as the input voltage ranges between preselected voltages $+E$ and $-E$, the output voltage tracks the input voltage. When the input voltage goes beyond $+E$ or $-E$, the output voltage is clamped to $+E$ or $-E$. When, thereafter, the input voltage is changed in the opposite sense by X volts, where $|X| \leq 2E$ below its maximum value the output voltage changes by X volts.

The clamping circuit utilizes a differential amplifier and circuits providing two feedback paths between the output and inverting input of the amplifier, one or the other being operable dependent on the value of input signal to provide the clamping action described above.

4 Claims, 3 Drawing Figures

VOLTAGE CLAMP CIRCUIT UTILIZING AN ACTIVE DEVICE

The U.S. Government has rights in this invention pursuant to Contract No. DAAB07-77-C-3298 awarded by the Department of the Army.

This invention relates to clamp circuits and more particularly to such circuits using an active component.

In the prior art, clamp circuits, similar to that illustrated in FIG. 2 of the instant application, are known which differ from FIG. 2 only in that the diodes are real diodes which exhibit the properties of gradual turn on, a diode threshold and temperature effect on the diode threshold. A clamp of the type illustrated in FIG. 2 produces a maximum positive output +E (the diode threshold will be ignored) when the input goes to or above +E. When the input drops from its maximum value to a voltage (which could still be well above +E) the output also decreases from +E by the amount of the decrease in input voltage until the output has dropped by 2E at which point the output voltage remains fixed at −E.

This circuit is to be contrasted with one termed a limiter in which, so long as the input voltage remains above +E, the output voltage remains at +E, and so long as the input voltage remains below −E, the output voltage remains at −E. For other input voltages the output voltage tracks the input voltage.

In accordance with a preferred embodiment of the present invention a clamp circuit connected between a circuit input terminal and a circuit output terminal comprises a capacitor connected between the circuit input and output terminals, a high gain differential amplifier having a non-inverting input terminal coupled to circuit ground and an inverting input terminal resistively coupled to the circuit output terminal and has an output terminal connection. The clamp circuit also comprises first and second selectively operable impedances between the circuit output terminal and circuit ground.

The first impedance is resistive. The means providing the first impedance comprises means for providing a first selectively operable feedback path from the amplifier output terminal to the amplifier inverting input terminal, including biasing means for causing the feedback means to be operable when a signal applied at the circuit input terminal changes value by less than a given amount dependent on the value of the bias of the biasing means and to otherwise be inoperable.

The second impedance has a characteristic of a perfect diode conducting into a perfect voltage source. The means providing the second impedance comprises means providing a second selectively operable feedback path for feeding signals from the amplifier output terminal to the circuit output terminal and via the resistive coupling to the inverting input terminal.

The amplifier is responsive to the inoperable condition of the first feedback means for causing the second feedback means to be operable.

Figure 1:
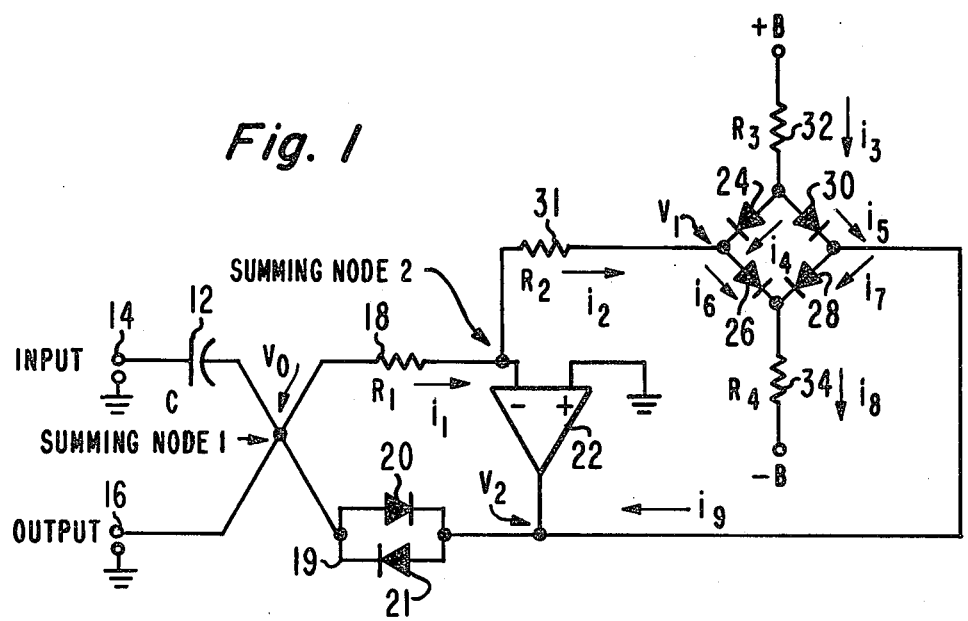
FIG. 1 is a clamp circuit in accordance with a preferred embodiment of the present invention in electrical schematic form.

With reference to FIG. 1 a capacitor 12 is connected between a signal input terminal 14 and a summing node 1. Node 1 is connected to an output terminal 16. One end of each of a resistor 18 and bidirectional diode assembly 19 are connected to node 1. The other ends of the resistor 18 and bidirectional diode assembly 19 are connected respectively to summing node 2 and to the output terminal of a high gain differential amplifier 22. The non-inverting input terminal (+) of amplifier 22 is connected to a circuit reference potential such as ground while the inverting (−) input terminal is connected to node 2. Amplifier 22 typically has an amplification gain greater than $10^4$. The combination of diode assembly 19 and resistor 18 provides a selectively operable feedback path from the output of amplifier 22 to its inverting input.

Figure 2:
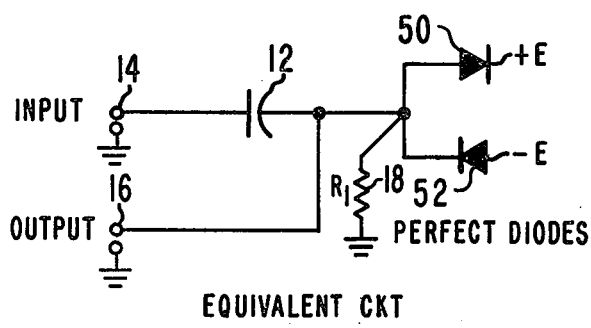
FIG. 2 is an equivalent circuit of the clamp circuit of FIG. 1.

A full wave four terminal diode bridge comprises series connected diodes 24 and 26, and series connected diodes 28 and 30. The junction of the cathode of diode 24 and the anode of diode 26 is connected via resistor 31 (also termed $R_2$) to the inverting terminal of amplifier 22. In a practical embodiment resistor 31 would not exist as a separate element, but resistor 31 represents the resistance in the path between the output of amplifier 22 and the (−) input of amplifier 22, particularly the resistance of diodes 24–30. The junction of the anode of diode 28 and cathode of diode 30 is connected to the output terminal of amplifier 22. The anodes of diodes 24 and 30 are connected through a resistor 32 (also termed $R_3$) to a source of potential $$+B=[(R_3/R_1)E+V_D]\text{volts,} \quad (1)$$

where E is the voltage applied to the diodes in FIG. 2 and the voltage to which output terminal 16 is clamped and $V_D$ is the voltage drop across any of diodes 24–30. Similarly, the cathodes of resistors 26 and 28 are connected through a resistor 34 (also termed $R_4$) and normally made essentially equal to $R_3$ to a source of potential (−B), again typically referenced to circuit ground. The combination of +B and $R_3$ acts as a constant current source (current substantially invariant with load) producing current $i_3$. Similarly, −B and $R_4$ act as a negative constant current source sinking current $i_8$. The combination of diodes 24–30, current sources $i_3$ and $i_8$ and resistor 31 provides a selectively operable feedback path from the output of amplifier 22 to its inverting input.

With reference to FIG. 2, which is an equivalent circuit to the circuit of FIG. 1, and where elements similar to those in FIG. 1 are similarly legended, capacitor 12 is connected between circuit input terminal 14 and circuit output terminal 16. Output terminal 16 is also connected to the anode of a perfect diode 50, the cathode of which is connected to a perfect voltage source of reference potential +E. The output terminal 16 is also connected to the cathode of a perfect diode 52, the anode of which is connected to a perfect voltage source of reference potential −E. A perfect diode is defined as one which is unaffected by temperature and has zero impedance when the voltage at the anode attempts to increase above that at the cathode and otherwise has an infinite impedance. A perfect voltage source is one which maintains a constant potential with changing current. Resistor 18 in FIG. 2 is included to provide exact equivalence between the circuits of FIGS. 1 and 2 with regard to signals at terminals 14 and 16.

Figure 3:
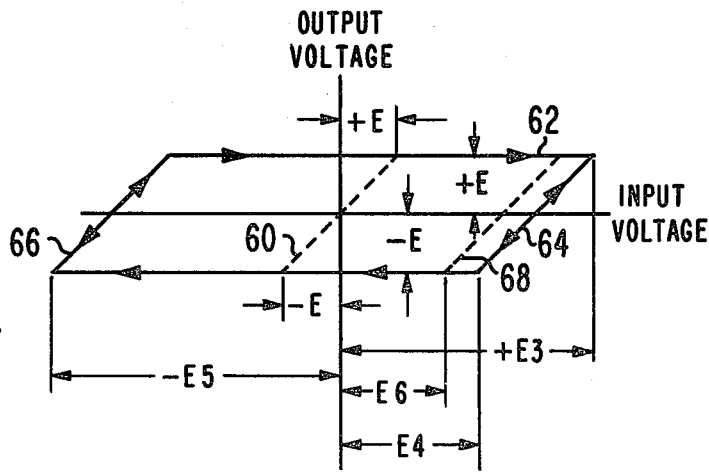
FIG. 3 is a diagram of a transfer function of the circuits of FIGS. 1 and 2.

First, the operation of the equivalent circuit of FIG. 2 will be given with reference as appropriate to FIG. 3 then a detailed description of the operation of FIG. 1 will follow. Assuming for convenience in explaining circuit operation that capacitor 12 is initially discharged and given an input potential ranging between +E and −E (along dashed line 60, FIG. 3) the output voltage at terminal 16 will track the input voltage lagging in time only due to the effect of capacitor 12. The impedance measured between output terminal 16 and circuit ground is $R_1$, the value of resistor 18 ignoring the effects of capacitor 12. The capacitor is valued such as to be a low impedance at the frequencies of interest in the input signal applied to circuit terminal 14. If the input voltage begins to rise to and above +E (upward and to the right along lines 60 and 62 of FIG. 3) the output voltage will rise to and be clamped to +E regardless of the amplitude (for example, +E3, FIG. 3) to which the input voltage rises and capacitor 12 will be charged to, for example, E3−E volts. This is so since, as mentioned above, diode 20 is either infinite impedance or zero impedance and +E volts does not change regardless of the current drawn therefrom. Therefore when the input potential goes above +E, the output impedance is no longer $R_1$, but rather zero impedance. Now assume that the input voltage begins to fall from its peak value +E3, the output voltage immediately begins to fall from its peak value of +E (along line 64, FIG. 3). This falling output voltage continues until the input voltage falls by an amount 2E below E3 to a value E4, for example, as illustrated in FIG. 3 at which time the voltage of the output terminal 16 having fallen to −E is clamped to −E by diode 52.

If the input voltage is between E4 and E3, the output voltage will simply track between +E and −E (along line 64, FIG. 3) and the output impedance will again be $R_1$. If the input voltage, however, goes from a relatively high positive voltage, such as E4, to a relatively high negative voltage, such as −E5, as illustrated in FIG. 3, the output voltage at terminal 16 will remain clamped at −E and the output impedance will drop to zero. However, the instant that the input voltage begins to rise again the output voltage begins to rise as illustrated, for example, by line 66 for an input voltage beginning at −E5 or by, for example, line 68 for an input voltage beginning at E6 only slightly less than E4.

Operation of the circuit of FIG. 2 for an initially negative going large voltage is similar to that just described for an initially large positive going voltage except that, of course, the various polarities are reversed.

Referring to FIG. 1 the description of operation depends on whether small or large signals are applied to terminal 14. Small signals are defined such that $V_2$ measured between the output of amplifier 22 and circuit ground is within the voltage of one diode drop of the voltage $V_0$ measured between summing node 1 and circuit ground. Large signals are defined such that $V_2$ is not within the voltage of one diode drop of the voltage $V_0$. In the small signal case neither diode 20 nor 21 conducts. In the large signal case, that is, when $|V_2 - V_0|$ is greater than one diode drop, one of diodes 20 or 21 conducts.

For small signals the output at terminal 16 is merely a replica of the signal applied at terminal 14 offset by any DC potential across capacitor 12. In the small signal application current is flowing in all four diodes 24, 26, 28, 30 (hereinafter diodes 24–30) and not flowing in diodes 20 and 21 thus creating a feedback path from the output of amplifier 22 through diodes 24–30 and resistor 31 to the inverting input of amplifier 22. So long as the feedback path from the output of amplifier 22 through diodes 24–30 and resistor 31 to the inverting (−) input of amplifier 22 exists, the impedance at summing node 2 is at virtual circuit ground and the voltage on the (−) terminal of the amplifier 22 is negligible. Because the impedance at summing node 2 is at virtual ground, the impedance between output terminal 16 and circuit ground is $R_1$, the value of resistor 18. Because the voltage of summing node 2 is negligible, at summing node 2, since essentially no current is drawn by amplifier 22, $i_1 = i_2$ and $V_1/V_0 = -R_2/R_1$. Assuming that a positively changing input signal is applied to terminal 14 causing $i_1$ to increase, then in accordance with Kirchoff's current law $i_2$ will increase. It will be further assumed that $i_3$ and $i_8$ remain equal and constant since $R_3 = R_4$, $|+B| = |-B|$ and the combination of +B and resistor $R_3$ and the combination of −B and resistor $R_4$ essentially form current sources. Therefore:

$$i_3 = i_8 = (2B - 2V_D)/2R_3 \qquad (2)$$

where, as before, $V_D$ is the voltage drop across each of diodes 24–30.
Substituting formula (1) for B:

$$[(R_3/R_1)E + V_D - V_D]/R_3 = E/R_1 = i_3 = i_8 \qquad (3)$$

As $i_2$ increases, $i_6$ and $i_5$ increase while $i_4$ and $i_7$ decrease. For $i_5$ to increase and $i_7$ to decrease the voltage at the output of amplifier 22 must decrease which occurs as a result of the positively directed voltage applied to the inverting (−) terminal of amplifier 22.

If the positively directed input voltage rises until $V_0 = +E$ volts, then $i_1 = E/R_1 = i_8 = i_2 = i_6$. At that time $i_4$ is forced to zero current and diode 24 ceases conducting current. Likewise, since $i_3 = i_5 = i_9$, $i_7$ is forced to zero current and diode 28 ceases conducting current. If thereafter even the slightest additional positive voltage is applied to terminal 14, the further negative output from amplifier 22 causes diodes 24 and 28 to open breaking the feedback path from the output of amplifier 22 through diodes 24–28 and resistor 31 to the input of amplifier 22.

Without feedback, the amplifier can no longer adjust its output voltage as required to keep $i_1$ approximately equal to $i_2$. Current $i_2$ is constrained to be no larger than $i_8$ since diodes 24 and 28 are open, hence any increase in $i_1$ must flow into the (−) input of amplifier 22. In response, amplifier 22 slews negative until diode 20 starts to conduct. The current conducted by diode 20 alters the current balance at summing node 1 until $i_1$ differs from $i_2$ by the vanishingly small input current to amplifier 22.

It can be seen now that amplifier 22 is operational about one of two summing nodes, 1 or 2, depending on whether $V_0$ is equal to or less than +E volts, or, said another way, on whether the feedback path through diode assembly 19 or diode quad 24–30 is operational.

It is known that a summing node has the property of being a virtual (AC) ground. For small signals where diodes 20 and 21 (or their equivalents 50 and 52) are not conducting, the virtual ground in FIG. 1 is node 2. This virtual ground is of no advantage to circuit operation nor is it of any disadvantage. Output signals attempting to go above +E volts cause the virtual ground to shift to node 1 and the essential property of the invention is realized. Any attempted increase of $V_0$ above $+E$ volts results in the formation of a virtual ground at summing node 1 to prevent its happening.

The circuit of FIG. 1 looking to the right of summing node 1 can be seen to be equivalent to a resistor $R_1$ to ground when $|V_0|<E$. When $|V_0|=E$, any amount of current forced into summing node 1 from input 14 via capacitor 12 is removed by diode 20 so $|V_0|$ cannot rise above E volts which is equivalent to a perfect diode conducting into a perfect voltage source. That is, when diode 20 is conductive resulting in a feedback path for the output of amplifier 22 through diode 20 and resistor 18 to the inverting input of amplifier 22, the impedance between output terminal 16 and circuit ground is zero at $+E$ volts. The equivalence to the circuit of FIG. 2 is thus shown.

As the input voltage to terminal 14 drops from whatever peak value it reaches by any amount the voltage at the output of amplifier 22 begins to rise causing a reduction in current in diodes 26 and 30 and consequent current flow in diodes 24 and 28 causing the feedback path in the output of amplifier 22 through diodes 24–30 to the inverting input of amplifier 22 to be re-established. At the same time, diode 20 ceases conduction.

If the input voltage continues in a negative direction such that current ceases to flow through diodes 26 and 30, these diodes will open causing amplifier 22 output to slew positive; concurrently diode 21 will be rendered conductive and $V_0$ will be clamped to $-E$. Again, as with the previous example in which a positively increasing voltage was considered, with the case of the negatively increasing voltage when that voltage reaches a negative peak and turns around the currents are changed such that diode 21 opens and the path is re-established through the diodes 24–30.

What is claimed is:

1. A clamp circuit connected between a circuit input terminal and a circuit output terminal comprising, in combination:

a capacitor connected between the circuit input and output terminals;

a high gain differential amplifier having a non-inverting input terminal referenced to circuit ground and an inverting input terminal resistively coupled to said circuit output terminal, said amplifier having an output terminal connection;

means providing a first selectively operable impedance between said circuit output terminal and said circuit ground, said first impedance being resistive, said means providing first impedance comprising means providing a first selectively operable feedback circuit path from said amplifier output terminal connection to said amplifier inverting input terminal, including biasing means for causing said feedback means to be operable when a signal applied at said circuit input terminal changes value by less than a given amount dependent on the value of the bias of said biasing means and to otherwise be inoperable; and means providing a second selectively operable impedance between said circuit output terminal and said circuit ground, said second impedance having a characteristic of a perfect diode conducting current into a perfect voltage source, said second means providing said second impedance comprising means providing a second selectively operable feedback path for feeding signals from said amplifier output terminal connection to said circuit output terminal and via said resistive coupling to said inverting input terminal;

said amplifier being responsive to said inoperable condition of said first feedback means for causing said second feedback means to be operable.

2. The combination as set forth in claim 1 wherein said means providing said first feedback path comprises a full wave rectifier, said rectifier comprising first, second, third and fourth diodes, the cathode and anode of said first and second diodes respectively being coupled to said amplifier inverting input terminal, the cathode and anode of said third and fourth diodes respectively being coupled to said amplifier output terminal connection, the anodes of said first and third diodes and cathodes of said second and fourth diodes being coupled to said biasing means.

3. The combination as set forth in claim 2 wherein said bias means comprises a constant current source connected to said anodes of said first and third diodes and a second constant current source connected to said cathodes of said third and fourth diodes.

4. The combination as set forth in claims 1, 2 or 3 wherein said means providing said second feedback path comprises a bidirectional diode coupled between said amplifier output terminal connection and said circuit output terminal.

* * * * *